United States Patent [19]
Song et al.

[11] Patent Number: 5,990,986
[45] Date of Patent: Nov. 23, 1999

[54] THIN FILM TRANSISTOR SUBSTRATE FOR A LIQUID CRYSTAL DISPLAY HAVING BUFFER LAYERS AND A MANUFACTURING METHOD THEREOF

[75] Inventors: Jean-Ho Song, Scongnam; Sang-Ki Kwak, Seoul, both of Rep. of Korea

[73] Assignee: Samsung Electronics Co., Ltd., Rep. of Korea

[21] Appl. No.: 09/087,407

[22] Filed: May 29, 1998

[30] Foreign Application Priority Data

May 30, 1997 [KR] Rep. of Korea ...................... 97-22145
Sep. 25, 1997 [KR] Rep. of Korea ...................... 97-48773

[51] Int. Cl.⁶ .......................... G02F 1/136; G02F 1/1343
[52] U.S. Cl. ............................... 349/43; 349/147; 257/59
[58] Field of Search .................................. 349/42, 43, 44, 349/122, 143, 138, 147, 187; 257/59, 72

[56] References Cited

U.S. PATENT DOCUMENTS 5,805,250  9/1998  Hatano et al. ........................... 349/138
5,814,836  9/1998  Hyun ......................................... 257/72

*Primary Examiner*—Hung Xuan Dang
*Assistant Examiner*—Tai V. Duong
*Attorney, Agent, or Firm*—Myers Bigel Sibley & Sajovec

[57] ABSTRACT

Gate wire is formed on a transparent glass substrate, and a gate insulating film, an amorphous silicon layer, a doped amorphous silicon layer and Cr layer are deposited in sequence. After patterning the Cr layer, the doped amorphous silicon layer and the amorphous silicon layer, an ITO (indium-tin-oxide) layer is deposited and patterned, and then the exposed portions of the Cr layer and of the doped amorphous silicon layer are removed. A passivation film is deposited and patterned to form a plurality of contact holes over the ITO layer, and then a conductive layer is deposited and patterned to form a data line which is connected to the ITO layer through the contact holes.

10 Claims, 9 Drawing Sheets

THIN FILM TRANSISTOR SUBSTRATE FOR A LIQUID CRYSTAL DISPLAY HAVING BUFFER LAYERS AND A MANUFACTURING METHOD THEREOF

BACKGROUND OF THE INVENTION (a) Field of the Invention

The present invention relates to a thin film transistor substrate for a liquid crystal display and a manufacturing method thereof, in particular, to a thin film transistor substrate having buffer layers and a manufacturing method thereof (b) Description of the Related Art A thin film transistor liquid crystal display is a widely used display and is manufactured by using several photo masks.

A conventional substrate for liquid crystal display is described with reference to FIG. 1.

FIG. 1 shows a cross sectional view of a conventional thin film transistor for a liquid crystal display shown in the specification of Korean Patent Application No. 95-52714. A gate pattern including a gate electrode 33a is formed on a substrate 31 and an anodic oxidation film 35 is formed on the gate pattern. A gate insulating film 37 is formed thereon and an active pattern 39 is formed on the gate insulating film 37 at the position corresponding to the gate electrode 33a. An indium-tin-oxide (ITO) is formed on the active pattern 39 and the gate insulating film 37 and divided into two portions 410 and 420 with respect to the gate electrode 33a. One of the portions is a source electrode and the other is a drain electrode. A passivation film 43 covers the source electrode, the drain electrode and the active pattern 39. The passivation film 43 has a contact hole exposing the portion 420, and the portion 420 contacts a data line 45 through the contact hole.

However, in this thin film transistor, contact resistance between the active pattern 39 and the ITO film 420 is large because the active pattern 39 directly contacts the ITO film 420. In addition, the portion of the data line 45 which plays a role of contact pad may not be protected because the data line 45 is formed over the ITO film 420.

SUMMARY OF THE INVENTION

One object of the invention is to reduce contact resistance between a transparent electrode and an active pattern.

Another object of the invention is to repair the defected data lines with ease.

Another object of the invention is to improve contact reliability of a bonding pad of a data line.

To achieve these objects of the present invention, buffer layers are interposed between transparent electrodes and a semiconductor film to reduce contact resistance therebetween.

In particular, a gate line and a gate electrode which is connected to the gate line are formed on a substrate, and a gate insulating film is formed thereon. A semiconductor layer is formed on a portion of the gate insulating film over the gate electrode, and a first and a second buffer layers are formed on the semiconductor layer and opposite each other with respect to the gate electrode. A first and a second transparent conductive layers are formed respectively on the first and the second buffer layers and a passivation film having a contact hole is formed thereon. A data line is formed on the passivation film and connected to the first transparent conductive layer through the contact hole.

The semiconductor layer may be made of an amorphous silicon and doped amorphous silicon layers may be interposed between the semiconductor layer and the first and the second buffer layers. The first and the second transparent conductive films may be made of indium-tin-oxide, and the first and the second buffer layers may be made of at least one selected from the group consisting of Cr, W, Mo or Mo—W alloy.

The second buffer layer and the second transparent conductive layer may be formed along the shape of the data line.

The thin film transistor substrate for a liquid crystal display, a gate wire including a gate line is manufactured, according to the present invention, by forming a gate electrode and a gate pad on a transparent insulating substrate. A gate insulating film, an amorphous silicon layer, an undoped amorphous silicon layer and a metal layer are deposited in sequence. After the metal layer, the doped amorphous silicon layer and the doped amorphous silicon layer are patterned, a first and a second transparent conductive layers which are separated from each other with respect to the gate electrode and covers the metal layer are formed. Next, the portions of the metal layer which are not covered with the first and the second transparent layers and the portions of the doped amorphous silicon layer thereunder are removed. A passivation film is deposited and then etched to form a plurality of contact holes over the portion of the gate pad and the second transparent conductive layer. After the portion of the gate insulator film over the gate pad is etched, a conductive layer is deposited and then etched to form the a data line which is connected to the second transparent conductive layer through the contact holes.

DETAILED DESCRIPTION OF THE PREFERRED EMBODIMENTS

Figure 1:
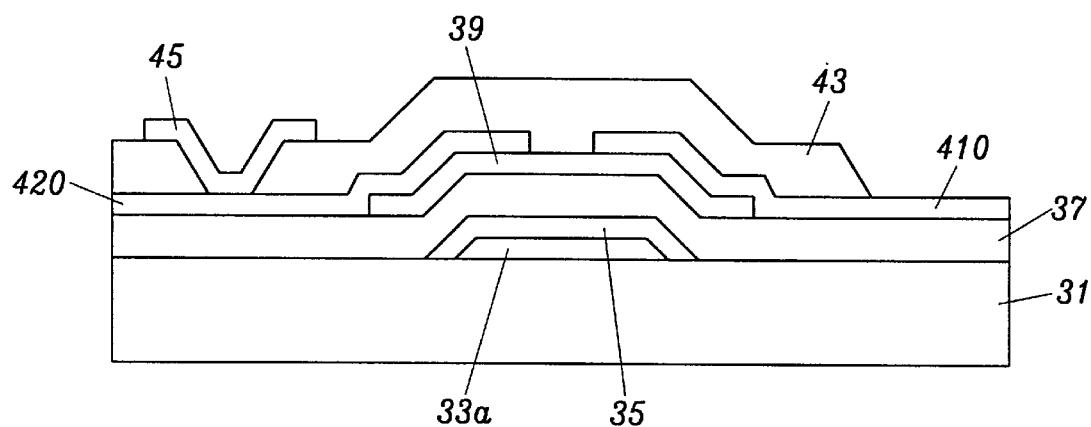
FIG. 1 shows a cross sectional view of a thin film transistor according to a conventional thin film transistor substrate.

The present invention now will be described more fully hereinafter with reference to the accompanying drawings, in which preferred embodiments of the invention are shown. This invention may, however, be embodied in many different forms and should not be constructed as limited to the embodiments set forth herein; rather, these inventions are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present.

Figure 2:
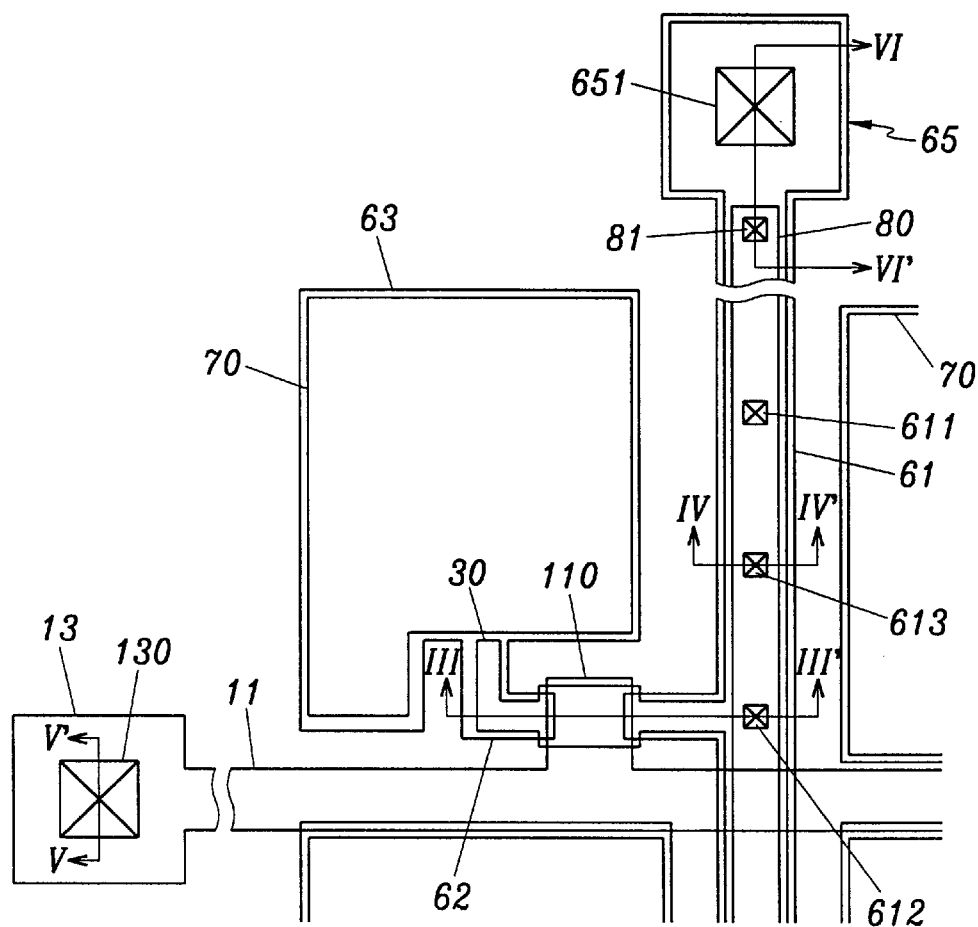
FIG. 2 shows a layout view of a thin film transistor substrate according to an embodiment of the present invention.
Figure 3:
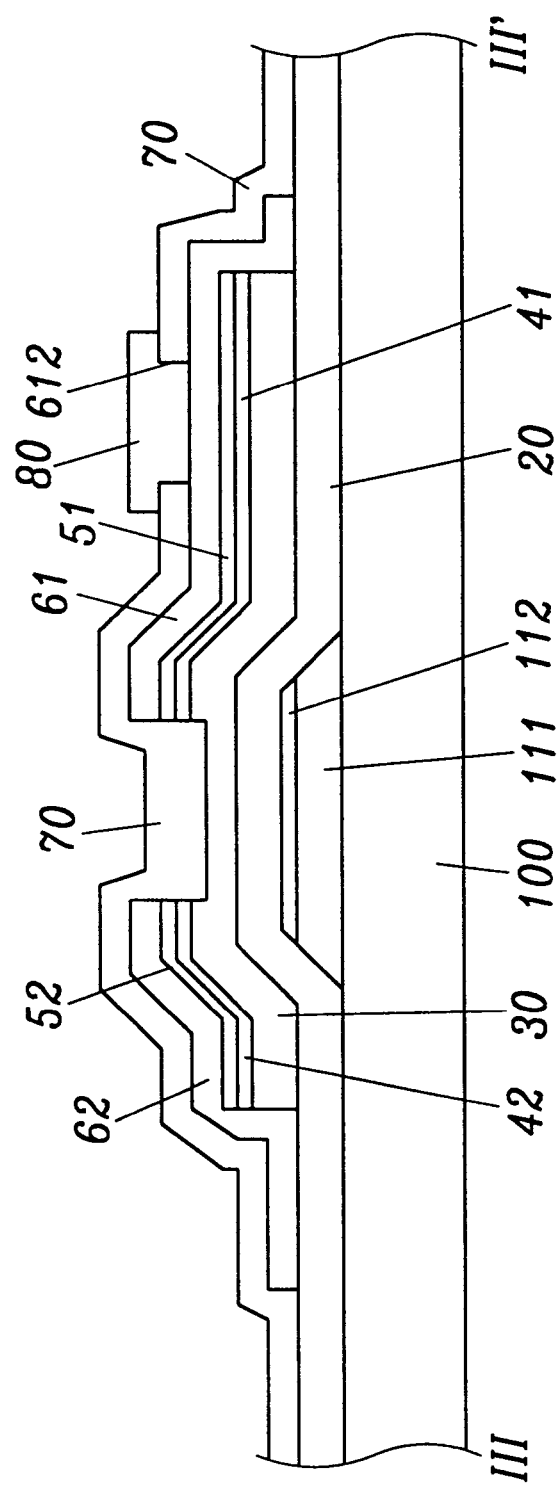
FIG. 3 to FIG. 6 show cross sectional views of the thin film transistor substrate shown in FIG. 2 taken along lines III—III', IV—IV', V—V' and VI—VI'.
Figure 4:
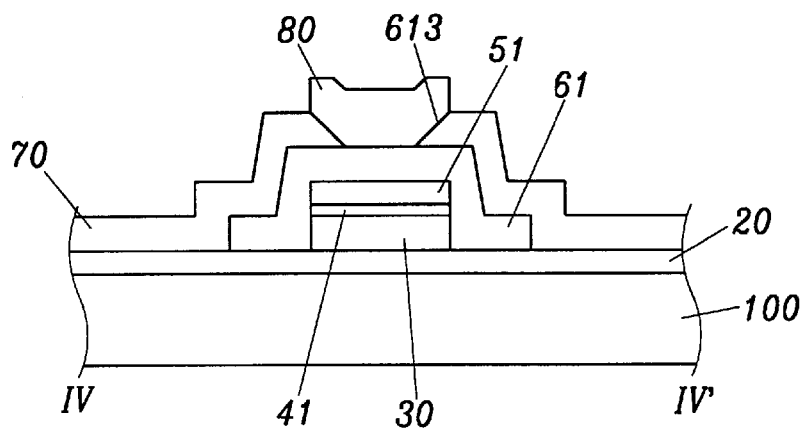

FIG. 2 shows a layout view of a thin film transistor substrate for a liquid crystal display according to an embodiment of the present invention, FIG. 3 to FIG. 6 show cross sectional views of the thin film transistor substrate shown in FIG. 2 taken along lines III—III', IV—IV', V—V' and VI—VI'. Of these cross sectional views, FIG. 3 shows a thin film transistor.

The structure of the thin film transistor substrate according to an embodiment of the present invention is described in detail with reference to FIG. 2 to FIG. 6.

Figure 5:
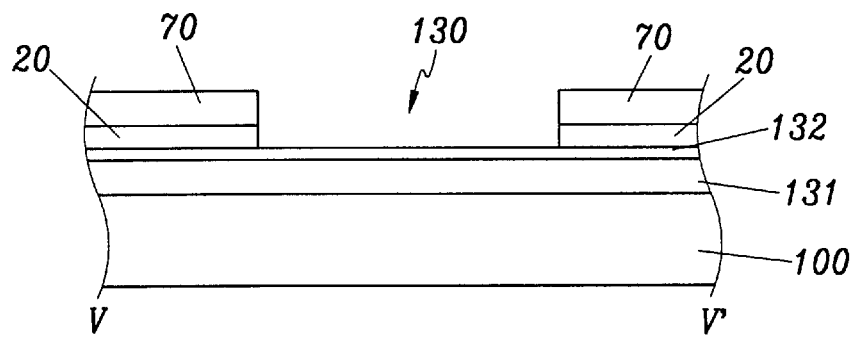
Figure 6:
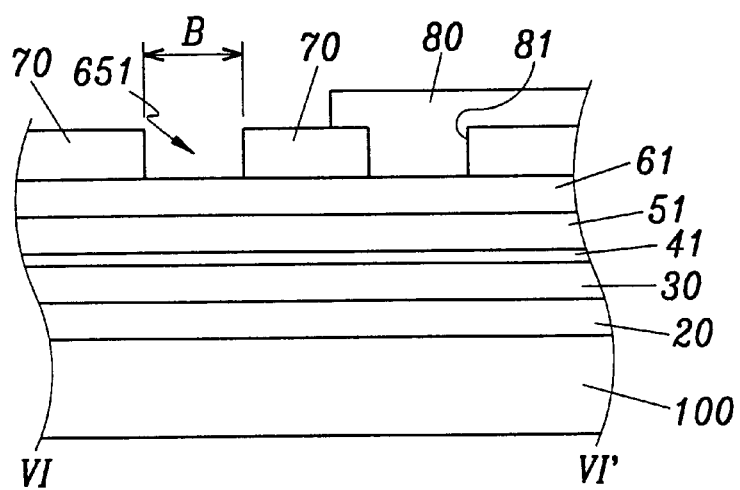

Gate wire having a double-layered structure including an Al alloy layer 111 and a Mo layer 112 is formed on a substrate 100 made of a transparent insulating material such as glass. The gate wire includes a gate line 11, a gate pad 13 and a gate electrode 110 of a thin film transistor, and the gate wire transmits scanning signals. The gate line 11 extends in a horizontal direction, a portion or a branch of the gate line 11 plays the role of the gate electrode 110, and an end of the gate line 11 is connected to the gate pad 13. FIG. 3 and FIG. 5 show both of the gate electrode 110 and the gate pad 13 having an Al alloy layer 111 and 131 as a lower layer and a Mo layer 112 and 132 as an upper layer.

In FIG. 2, all portions of the gate wire except the gate electrode 110 and the gate pad 13 is represented as a single reference numeral 11.

A gate insulating film 20 which is made of an insulator such as silicon oxide or silicon nitride is formed on the gate wire 11, 110 and 13. In case that the upper layer of the gate wire 11, 110 and 13 is made of materials which can be anodically oxidized, an upper portion of the gate wire 11, 110 and 13 may be oxidized to form an oxidation film between the gate wire 11, 110 and 13 and the gate insulating layer 20. The gate insulating film 20 has a contact hole 130 exposing the gate pad 13.

A layer 30 made of a semiconductor such as amorphous silicon is formed on the gate insulating film 20. The amorphous silicon layer 30 is formed on the portion of the gate insulating layer 20 over the gate electrode 102. The amorphous silicon layer serves as an active layer of the thin film transistor and extends in the vertical direction.

A heavily doped n-type amorphous silicon layer 41 and 42 is formed on the amorphous silicon layer 30, and a buffer layer 51 and 52 made of a conductive material such as Cr, Ta, Mo or Mo—W alloy is formed thereon. The buffer layer 51 and 52 and the amorphous silicon layer 40 have the same shapes, and each layer is divided into two portions 41 and 42; 51 and 52 with respect to the gate electrode 110. One 41 and 51 of the two portions extends along the amorphous silicon layer 30 in the vertical direction. As material of the buffer layer 51 and 52, it is suitable to choose a transition metal having small contact resistance with ITO and easily taper-etched.

A transparent conductive layer 61 and 62 made of a transparent conductive material such as ITO is formed on the buffer layer 51 and 52, a portion 61 of the transparent conductive layer extends along the portion 51 of the buffer layer. The rest portion 62 covers the portion 52 of the buffer layer, and extends and enlarges to from a pixel electrode 63.

A passivation film 70 is formed thereon except the pixel electrode 63. The passivation film 70 has contact holes 130 and 651 exposing the upper layer 132 of the gate pad 13 and the transparent conductive layer 61 of the data pad 65, and also has a plurality of contact holes 81, 611, 612 and 613 exposing the transparent conductive layer 61.

Finally, a data line 80 made of a conductive material such as Cr is formed along the transparent conductive layer 61 and connected to the transparent conductive layer 61 through the contact holes 81, 611, 612 and 613.

In this structure of the thin film transistor, contact resistance decreases compared with the conventional structure because the doped amorphous silicon layer 41 and 42 does not directly contact the transparent conductive layer 61 and 62 but contacts through the buffer layer 51 and 52. In addition, the data signals may not be cut off even though one of the layers 51, 61 and 80 has defects, because the data signals can be transmitted through any one of these layers 51, 60 and 80. Moreover, reliability of the wire increases because the Cr buffer layer 51 is protected by the ITO transparent conductive layer 61 at the data pad 65.

Next, a manufacturing method of the thin film transistor substrate shown in FIGS. 2–6 is described with reference to FIG. 2 and FIG. 7A to FIG. 7D. FIG. 7A to FIG. 7D are merged figures where the cross sections taken along the lines III—III', V—V' and VI—VI' of FIG. 2 are arranged in sequence from left to right.

Figure 7A:
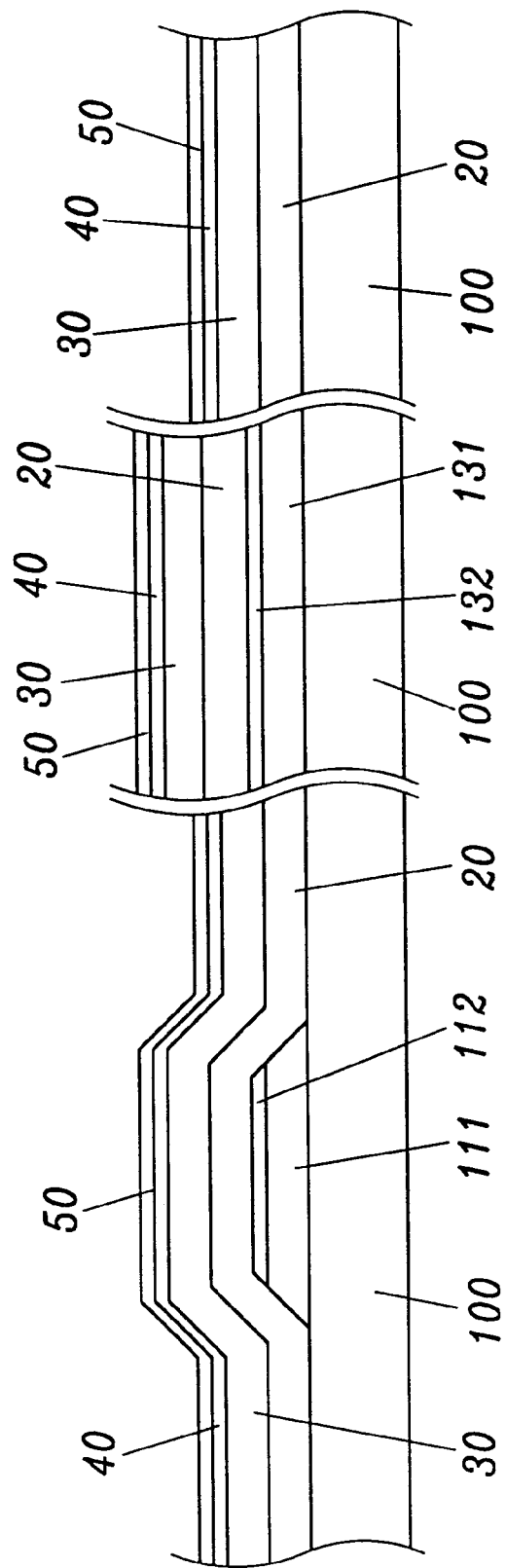
FIG. 7A to FIG. 7D show cross sectional views of the intermediate structures of the thin film transistor substrate shown in FIGS. 2–6 in accordance with a manufacturing method of the present invention.

First, an aluminum alloy film and a molybdenum film are deposited in sequence and patterned by using a first mask to form a gate wire 11 including a gate line 11, a gate pad 131 and 132 and a gate electrode 111 and 112. As shown in FIG. 7A, a gate insulating film 20, an amorphous silicon layer 30, a doped amorphous silicon layer 40 and a metal layer 50 are deposited sequentially.

Figure 7B:
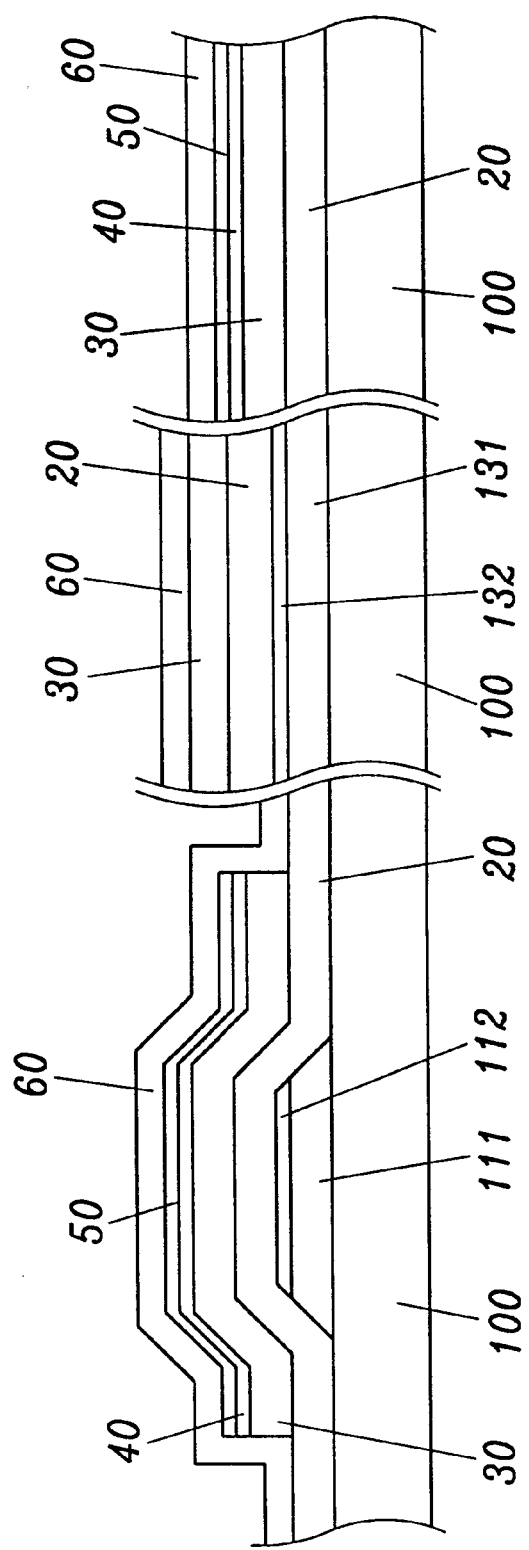
Figure 7C:
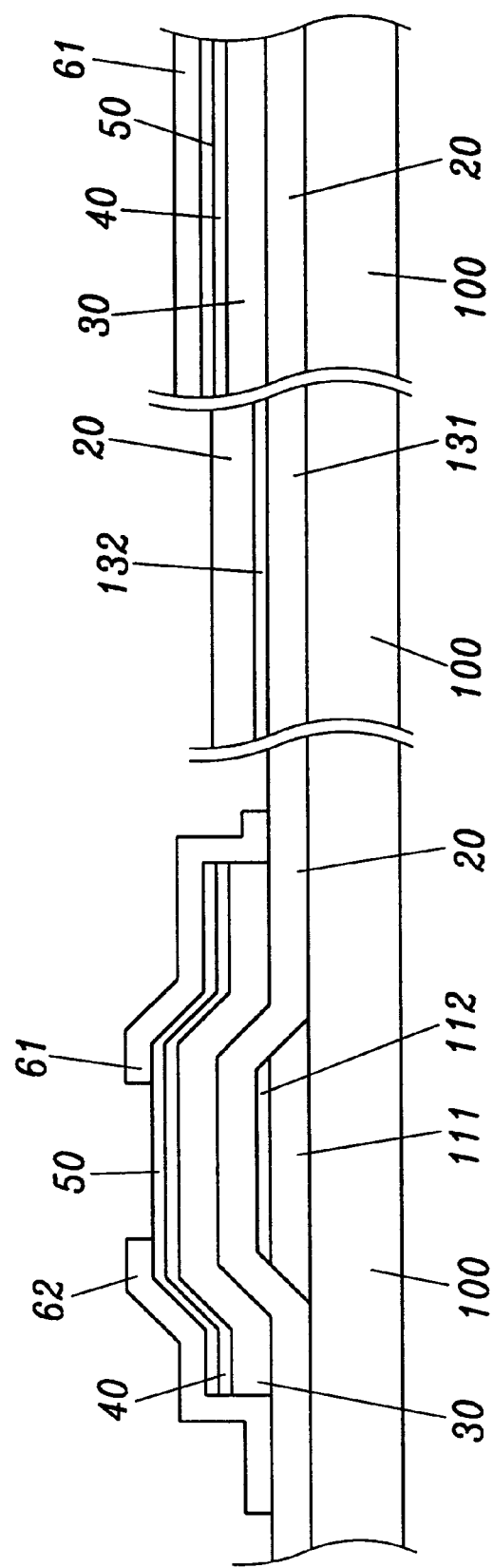

The metal layer 50, the doped amorphous silicon layer 40 and the amorphous silicon layer 30 are patterned by using a second mask. In this step, the portions of the layers 30, 40 and 50 on the gate pad 13 are removed. As shown in FIGS. 7B and 7C, a transparent conductive layer 60 of a material such as ITO is deposited thereon and patterned by using a third mask to form a transparent conductive layer 61 and 62.

Figure 7D:
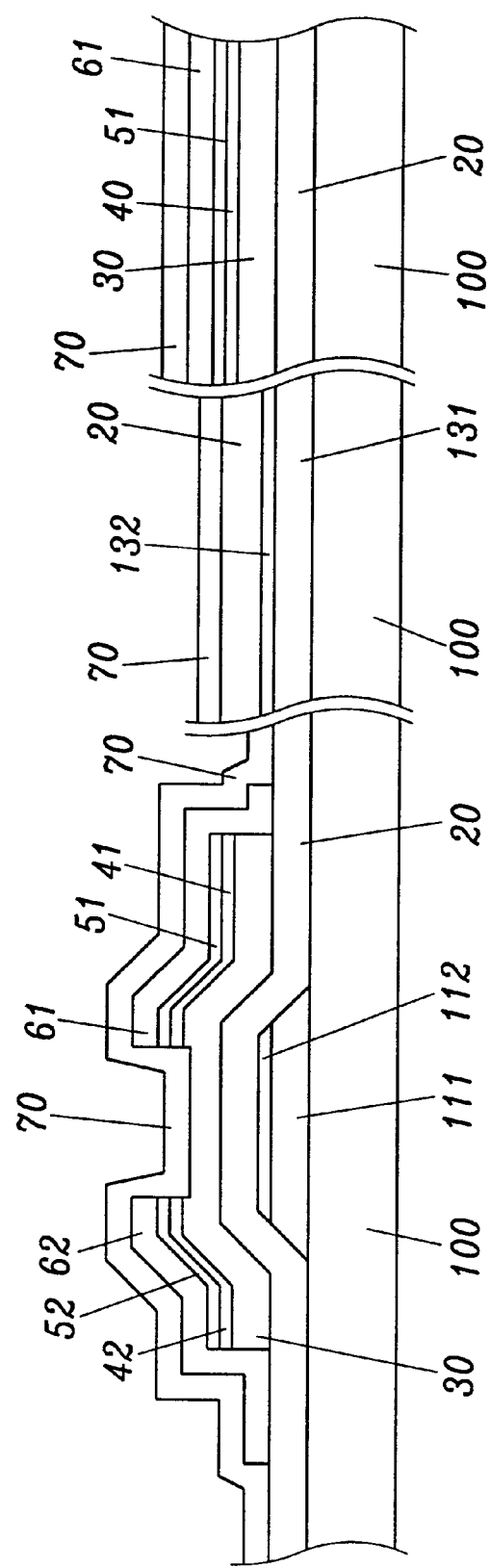

As shown in FIG. 7D, the portions of the metal layer 50 and the doped amorphous silicon layer 40 which are not covered with the transparent conductive layer 61 and 62 are removed, and a passivation film 70 is deposited thereon.

The passivation film 70 is etched by using a fourth mask to expose the pixel electrode 63. In this step, contact holes 130, 651, 81, 611, 612 and 613 exposing a portion of the gate insulating layer on the gate pad 13, a portion of the transparent conductive layer 61 corresponding to a data pad 65 and the vertical portion of the transparent conductive layer 61 are formed in the passivation film 70. Then, the exposed portion of the gate insulating film 20 is removed to expose the Mo upper layer 132 of the gate pad 13.

Next, a conductive layer of a material such as Cr is deposited and etched by using a fifth mask to form a data line 80. The data line 80 contacts the transparent conductive layer 61 through the contact holes 81, 611 612 and 613.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A thin film transistor substrate for a liquid crystal display comprising:

a transparent insulating substrate;

a gate line which is formed on the substrate;

a gate electrode which is connected to the gate line;

a gate insulating film which covers the gate line and the gate electrode;

a semiconductor layer which is formed on a portion of the gate insulating film over the gate electrode;

a first and a second buffer layers which are made of a metal, formed on the semiconductor layer and opposite each other with respect to the gate electrode;

a first and a second transparent conductive layers which are formed respectively on the first and the second buffer layers;

a pixel electrode which is connected to the second transparent conductive layer;

a passivation film which is formed on the first transparent conductive layer and has a first contact hole exposing the first transparent conductive layer; and a data line which is formed on the passivation film and connected to the first transparent conductive layer through the first contact hole.

2. The thin film transistor substrate according to claim 1, wherein the semiconductor layer is made of an amorphous silicon, and further comprising doped amorphous silicon layers between the semiconductor layer and the first and the second buffer layers.

3. The thin film transistor substrate according to claim 2, wherein the first and the second transparent conductive layers and the pixel electrode are made of indium-tin-oxide.

4. The thin film transistor substrate according to claim 3, wherein the first and the second buffer layers are made of at least one selected from the group consisting of Cr, Ta, Mo and Mo—W alloy.

5. The thin film transistor substrate according to claim 4, wherein the first buffer layer is formed along the shape of the data line.

6. The thin film transistor substrate according to claim 5, wherein the first transparent conductive layer is formed along the shape of the first buffer layer.

7. A manufacturing method of a thin film transistor substrate for a liquid crystal display comprising the steps of:

forming a gate wire including a gate line, a gate electrode connected to the gate line and a gate pad connected to an end of the gate line on a transparent insulating substrate;

depositing a gate insulating film, an undoped amorphous silicon layer, a doped amorphous silicon layer and a metal layer in sequence;

patterning the metal layer, the doped amorphous silicon layer and the undoped amorphous silicon layer;

forming a first and a second transparent conductive layers which are separated from each other with respect to the gate electrode and covers the metal layer;

removing portions of the metal layer which are not covered with the first and the second transparent layers and portions of the doped amorphous silicon layer thereunder;

depositing a passivation film;

etching the passivation film to form a first contact hole on a portion of the gate insulating film over the gate pad and a plurality of second holes exposing the first transparent conductive layer;

etching the portion of the gate insulating film under the first contact hole to expose the gate pad;

depositing a conductive film; and etching the conductive film to form a data line which is connected to the first transparent conductive layer through the second contact holes.

8. The manufacturing method according to claim 7, wherein the first and the second transparent conductive layers are made of indium-tin-oxide.

9. The manufacturing method according to claim 8, wherein the metal layer is made of at least one selected from the group consisting of Cr, Ta, Mo and Mo—W alloy.

10. The manufacturing method according to claim 9, wherein the first transparent conductive layer is formed along the shape of the date line.

* * * * *